United States Patent
Chen et al.

(10) Patent No.: US 11,942,465 B2
(45) Date of Patent: Mar. 26, 2024

(54) EMBEDDED STRUCTURE, MANUFACTURING METHOD THEREOF AND SUBSTRATE

(71) Applicant: Zhuhai ACCESS Semiconductor Co., Ltd, Zhuhai (CN)

(72) Inventors: Xianming Chen, Zhuhai (CN); Bingsen Xie, Zhuhai (CN); Benxia Huang, Zhuhai (CN); Lei Feng, Zhuhai (CN); Wenshi Wang, Zhuhai (CN)

(73) Assignee: Zhuhai ACCESS Semiconductor Co., Ltd., Zhuhai (CN)

( * ) Notice: Subject to any disclaimer, the term of this patent is extended or adjusted under 35 U.S.C. 154(b) by 349 days.

(21) Appl. No.: 17/388,099

(22) Filed: Jul. 29, 2021

(65) Prior Publication Data

US 2022/0059520 A1 Feb. 24, 2022

(30) Foreign Application Priority Data

Aug. 21, 2020 (CN) .......................... 202010847366.8

(51) Int. Cl.
*H01L 25/00* (2006.01)
*H01L 21/56* (2006.01)
(Continued)

(52) U.S. Cl.
CPC ............ *H01L 25/50* (2013.01); *H01L 21/568* (2013.01); *H01L 23/3121* (2013.01);
(Continued)

(58) Field of Classification Search
CPC . H01L 25/0655; H01L 24/20; H01L 23/3121; H01L 24/19; H01L 25/00; H01L 21/568
(Continued)

(56) References Cited

U.S. PATENT DOCUMENTS

2006/0170098 A1 8/2006 Hsu
2008/0277776 A1 11/2008 Enomoto
(Continued)

FOREIGN PATENT DOCUMENTS

| CN | 101789380 A | 7/2010 |
| CN | 105489565 A | 4/2016 |

(Continued)

OTHER PUBLICATIONS

First Office Action from related Chinese Appln. No. 2020108473668, dated Aug. 2, 2021. English translation attached. 9 pages.
(Continued)

*Primary Examiner* — Tremesha S Willis
(74) *Attorney, Agent, or Firm* — Grossman, Tucker, Perreault & Pfleger PLLC; Paul J. Kroon, Jr.

(57) ABSTRACT

Disclosed is a manufacturing method for an embedded structure. The method includes: preparing a temporary carrier board; preparing a second circuit layer on at least one of the upper surface and the lower surface of the temporary carrier board, and preparing a first dielectric layer to cover the second circuit layer; patterning and curing the first dielectric layer to form a cavity, mounting a device in the cavity, and performing hot-curing, wherein a surface of the device provided with a terminal faces an opening of the cavity; and preparing a second dielectric layer, wherein the device is embedded in the second dielectric layer, and a surface of the second dielectric layer is higher than a surface of the terminal by a preset value.

8 Claims, 9 Drawing Sheets

(51) Int. Cl.
  *H01L 23/00* (2006.01)
  *H01L 23/31* (2006.01)
  *H01L 25/065* (2023.01)

(52) U.S. Cl.
  CPC .............. *H01L 24/19* (2013.01); *H01L 24/20* (2013.01); *H01L 25/0655* (2013.01); *H01L 2224/2101* (2013.01)

(58) Field of Classification Search
  USPC ....................................................... 361/761
  See application file for complete search history.

(56) References Cited

U.S. PATENT DOCUMENTS

| | | |
|---|---|---|
| 2009/0236686 A1 | 9/2009 | Shim et al. |
| 2009/0294027 A1 | 12/2009 | Wang |
| 2014/0174805 A1 | 6/2014 | Haze |
| 2015/0250050 A1 | 9/2015 | Lee et al. |
| 2016/0260682 A1 | 9/2016 | Scanlan et al. |
| 2017/0213793 A1 | 7/2017 | Hurwitz et al. |
| 2018/0053732 A1 | 2/2018 | Baek et al. |

FOREIGN PATENT DOCUMENTS

| | | | |
|---|---|---|---|
| CN | 106997870 A | | 8/2017 |
| CN | 109727969 A | | 5/2019 |
| JP | 2006054322 A | | 2/2006 |
| JP | 2007201254 A | | 8/2007 |
| JP | 2013069808 A | | 4/2013 |
| JP | 2014075549 A | | 4/2014 |
| JP | 2014123702 A | | 7/2014 |
| JP | 2016100603 A | | 5/2016 |
| JP | 2016219730 A | | 12/2016 |
| JP | 2017017215 A | | 1/2017 |
| JP | 2018019071 A | | 2/2018 |
| JP | 2018198306 A | | 12/2018 |
| KR | 20150102504 A | | 9/2015 |
| KR | 20180128766 A | | 12/2018 |
| TW | 201145413 A | | 12/2011 |

OTHER PUBLICATIONS

First Search Report from corresponding Chinese Appln. No. 2020108473668, dated Aug. 21, 2020. English translation attached. 5 pages.

Decision to Grant from corresponding Japanese Appln. No. 2021-127727, dated Mar. 2, 2023. English translation attached. 5 pages.

Notice of Reasons for Refusal from corresponding Japanese Appln. No. 2021-127727, dated Aug. 8, 2022. English translation attached. 10 pages.

Search Report from corresponding Japanese Appln. No. 2021-127727, dated Aug. 5, 2022. English translation attached. 32 pages.

Decision to Grant from corresponding Korean Appln. No. 10-2021-0102410, dated Jun. 21, 2023. English translation attached. 7 pages.

First Office Action from related Korean Appln. No. 10-2021-0102410, dated Dec. 20, 2022. English translation attached. 17 pages.

Notice of Reasons for Refusal from corresponding Taiwanese Appln. No. 110124421, dated Sep. 19, 2022. English translation attached. 14 pages.

First Office Action from corresponding Taiwanese Appln. No. 110124421, dated Mar. 18, 2022. English translation attached. 13 pages.

EMBEDDED STRUCTURE, MANUFACTURING METHOD THEREOF AND SUBSTRATE

CROSS-REFERENCE TO RELATED APPLICATION

This application is based on and claims the benefit of priority from Chinese Patent Application No. 2020108473668, filed Aug. 21, 2020, the content of which is incorporated herein by reference in its entirety.

TECHNICAL FIELD

The present disclosure relates to the field of semiconductors, and in particular to an embedded structure, a manufacturing method thereof and a substrate.

BACKGROUND

With the vigorous development of the electronic industry, electronic products gradually tend to be multifunctional and high in performance. Electronic products are becoming smaller and more intelligent, and accordingly, the requirement for substrates and elements as core components in the electronic products, is getting higher and higher. Lightness, thinness and stable performance have become key factors in producing the electronic products.

How to simplify the process and realize the thinness and stable performance of a device packaging module has become a problem to be solved by major device manufacturers. The implementation of device embedding in the existing technology includes two steps, one step is to produce a rectangular cavity array polymer frame, and the other step is to implement the device embedding based on the polymer frame. The device embedding carried out in the two steps inevitably has the disadvantages of complex process flow, high manufacturing cost, thick package, etc. Moreover, the soldering between devices and a circuit will inevitably be carried out at the bottom of cavity, and as a result, the effect of soldering cannot be visually checked and the quality of embedding cannot be guaranteed.

In the existing technology, the devices and the circuit are soldered through different materials, which directly affects the stability of electrical signal connection between the devices and the circuit, leading to an increase in the defect rate of products. Moreover, when the devices and the circuit are soldered through solder, the size of the gap under the devices is unstable, the effect of filling is unstable when a dielectric material is laminated, and as a result, there may exist the potential of defective filling, affecting the reliability of the products.

SUMMARY

In view of the aforementioned defects of the existing technology, the main object of the present disclosure is to provide an embedded structure, a manufacturing method thereof and a substrate. The embedded structure, the manufacturing method thereof and the substrate have the advantages of simple device embedding process flow, less package thickness and more stable electric signal connection between devices and a circuit. This summary is not intended to limit the protection scope of the claims. Some technical schemes of the present disclosure are as follows:

In a first aspect, an embodiment of the present application provides a manufacturing method for an embedded structure, which includes: preparing a temporary carrier board; preparing a second circuit layer on at least one of the upper surface and the lower surface of the temporary carrier board, and preparing a first dielectric layer to cover the second circuit layer; patterning and curing the first dielectric layer to form a cavity, mounting a device in the cavity, and performing hot-curing, wherein a surface of the device provided with a terminal faces an opening of the cavity; preparing a second dielectric layer, wherein the device is embedded in the second dielectric layer, and a surface of the second dielectric layer is higher than a surface of the terminal by a preset value; preparing a first circuit layer connected to the terminal on the surface of the second dielectric layer and producing a metal pillar through the second dielectric layer, wherein the first circuit layer is connected to the second circuit layer through the metal pillar; dividing the temporary carrier board to form a first-stage embedded structure; and forming solder masks on both sides of the first-stage embedded structure, making openings in the solder masks to expose the surfaces of the second circuit layer and the first circuit layer, and metallizing the surfaces of the second circuit layer and the first circuit layer.

According to some embodiments of the present application, preparing a temporary carrier board; preparing a second circuit layer on at least one of the upper surface and the lower surface of the temporary carrier board comprises: laminating photoresist on at least one of the upper surface and the lower surface of the temporary carrier board; exposing and developing the photoresist to obtain a windowed pattern for the second circuit layer; and electroplating the windowed pattern and removing the photoresist to form the second circuit layer.

According to some embodiments of the present application, preparing a first circuit layer connected to the terminal on the surface of the second dielectric layer and producing a metal pillar through the second dielectric layer comprises: forming a metal seed layer on the surface of the second dielectric layer by electroless copper plating or sputtering; laminating photoresist, and patterning the photoresist to expose a pattern for the first circuit layer and a metal pillar pattern; and electroplating the pattern for the first circuit layer and the metal pillar pattern to form the first circuit layer and the metal pillar, wherein the first circuit layer is directly electrically connected to the terminal through the seed layer.

According to some embodiments of the present application, the range of the preset value is between 5 μm and 30 μm.

According to some embodiments of the present application, the temporary carrier board is of a four-layer symmetrical structure with an organic layer, a first metal layer, a second metal layer and a protective layer from the middle to both sides in sequence.

According to some embodiments of the present application, mounting a device in the cavity and performing hot-curing comprises: applying an ultra-thin film adhesive on a non-terminal surface of the device, and directly sticking the device to the temporary carrier board under the cavity by heating; or fixedly sticking the device to an adhesive material by applying the adhesive material to the bottom of the cavity.

According to some embodiments of the present application, the dielectric material of the first dielectric layer and the second dielectric layer is a photosensitive or non-photosensitive dielectric material.

In a second aspect, an embodiment of the present application provides a manufacturing method for an embedded structure, which includes: preparing a temporary carrier board, preparing a second circuit layer on at least one of the upper surface and the lower surface of the temporary carrier board, and preparing a first dielectric layer to cover the second circuit layer; patterning and curing the first dielectric layer to expose the surface of the second circuit layer, laminating and patterning a photoresist to obtain a metal pillar pattern, and forming metal a pillar by electroplating; removing the photoresist to form a cavity, mounting a device in the cavity, and performing hot-curing, wherein a surface of the device provided with a terminal faces a opening of the cavity; preparing a second dielectric layer, wherein the device is embedded in the second dielectric layer, and a surface of the second dielectric layer is higher than a surface of the terminal by a preset value; preparing a first circuit layer directly connected to the terminal on the surface of the second dielectric layer, wherein the first circuit layer is connected to the second circuit layer through the metal pillar; dividing the temporary carrier board to form a first-stage embedded structure; and forming solder masks on both sides of the first-stage embedded structure, making openings in the solder masks to expose the surfaces of the second circuit layer and the first circuit layer, and metallizing the surfaces of the second circuit layer and the first circuit layer.

In a third aspect, an embodiment of the present application provides an embedded structure, which includes: a dielectric layer, wherein the dielectric layer comprises a first surface and a second surface which are oppositely arranged; a device and a terminal embedded in the dielectric layer, wherein a difference between the surface of the device provided with the terminals and the first surface is a preset value, and a non-terminal surface of the device is coplanar with the second surface; a first circuit layer arranged on the first surface of the dielectric layer, wherein the first circuit layer is directly electrically connected to the terminal; a second circuit layer arranged coplanar with the second surface of the dielectric layer; and a metal pillar configured to connect the first circuit layer with the second circuit layer.

According to some embodiments of the present application, the range of the preset value is between 5 µm and 30 µm.

In a fourth aspect, an embodiment of the present application provides a substrate, including at least one layer of the embedded structure.

The embedded structure, the manufacturing method thereof and the substrate according to the present application at least have the following beneficial effects: the application of the preparation flow of the present application can reduce the process steps, decrease the difficulty of manufacturing, improve the quality of products and reduce the manufacturing cost; according to the configuration of the present application, the problem in the existing scheme that the connection between devices and a circuit requires accurate application of solder is effectively solved, and the devices and the circuit are integrally electroplated for connection by arranging the terminals upward after patterning, thus ensuring the stability of the connection between the devices and the circuit to ensure good electric signals and facilitating monitoring and inspection based on appearance in the process of implementation; by arranging the terminals upward, the device is connected to the carrying metal of the carrier board by applying an adhesive material or a DAF (ultra-thin film adhesive) on the whole back of the device, thereby effectively solving the potential problem of defective filling between the circuit and the device as a result of the terminals facing downward in the existing technology; by arranging the terminals upward to mount the device on the underlying carrier board for connection, the device and the circuit layer are on the same reference plane, thereby further reducing the overall thickness of the package.

The additional aspects and advantages of the present application will be partially set forth in the following description, and will partially become apparent from the following description or be understood through practice of the present disclosure.

BRIEF DESCRIPTION OF THE DRAWINGS

The aforementioned and/or additional aspects and advantages of the present application will become apparent and easily understood from the description of embodiments in reference to the following drawings, among which.

DETAILED DESCRIPTION

In order to make the object, technical scheme and advantages of the present application clearer, the present application is further described in detail below in reference to drawings and embodiments. It should be understood that the specific embodiments described here are merely intended to explain the present application rather than limit the present application, so they have no technically substantive significance. Any structural modification, proportional relationship change or size adjustment shall still fall within the scope of the technical content disclosed in the present application without affecting the efficacy and object achieved by the present application.

This section will describe the specific embodiments of the present application in detail, and the preferred embodiments of the present application are shown in the drawings. The purpose of the drawings is to supplement the description in the text of the specification with graphics, so that people can visually understand each technical feature and the overall technical scheme of the present application, but they cannot be understood as a limitation to the protection scope of the present application.

In the description of the present application, "a plurality of" means one or more, while "multiple" means two or more. "greater than", "less than", "exceed" and the like should be understood as excluding this number, while "more than", "less than", "within" and the like should be understood as including this number. If described, "first" and "second" are merely intended to distinguish technical features rather than understood as indicating or implying relative importance or implicitly indicating the number of indicated technical features or implicitly indicating the precedence relationship of the indicated technical features.

Figure 2:
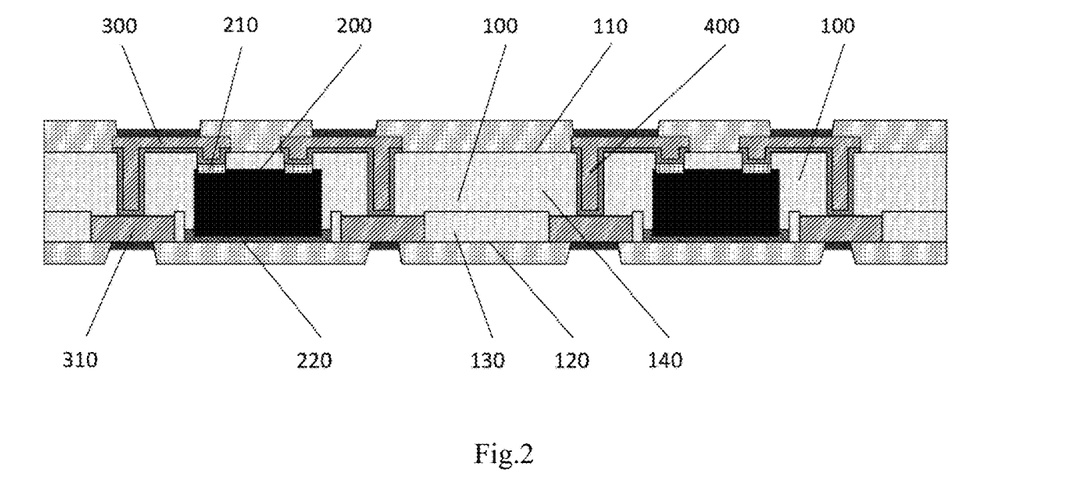
FIG. 2 is a schematic cross-sectional view of an overall structure according to an embodiment of the present application.
Figure 3:
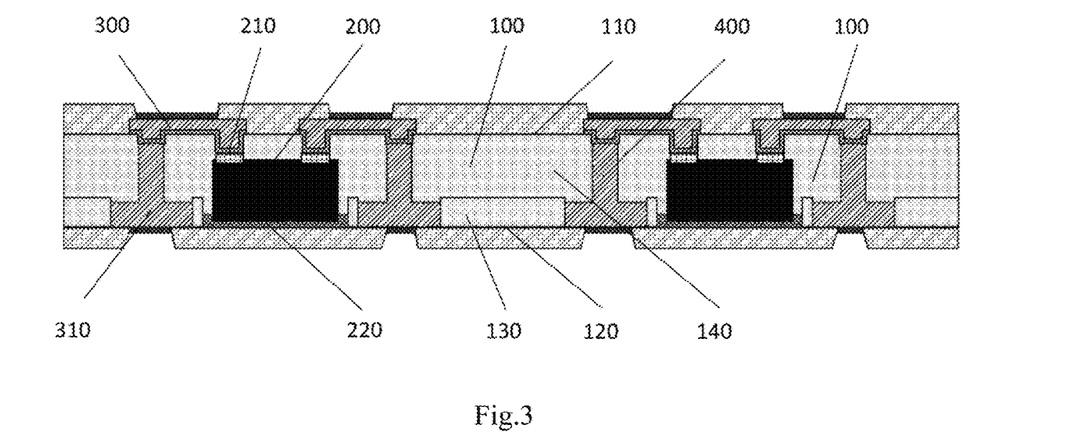
FIG. 3 is a schematic cross-sectional view of an overall structure according to another embodiment of the present application.

In order to facilitate understanding of an embedded structure provided by an embodiment of the present application, the specific structure will be described below with reference to the drawings. First, referring to FIG. 2 and FIG. 3, FIG. 2 shows a schematic cross-sectional view of the whole structure of an embedded structure, and FIG. 3 shows a schematic cross-sectional view of the whole structure of another embodiment of the embedded structure. It can be seen from FIG. 2 and FIG. 3 that an embedded structure mainly includes a dielectric layer 100, which includes a first dielectric layer 130 and a second dielectric layer 140. The dielectric layer 100 also includes a first surface 110 and a second surface 120 which are oppositely arranged. The dielectric material for producing the dielectric layer is generally one or a mixture of more of organic or inorganic dielectric materials, such as polyimide, epoxy resin, bismaleimide, triazine resin, ceramic filler and glass fiber, which are divided into a photosensitive type and a non-photosensitive type according to functional requirements at present. It can be understood that the photosensitive material can be selected as the dielectric material here.

As shown in FIG. 2, the embedded structure further includes devices 200 and terminals 210 embedded in the dielectric layer. The front of the device 200 is provided with the terminals 210. The difference between the surface of the terminal 210 and the first surface 110 is within a set range, which is between 5 μm and 30 μm here, and different differences, such as 5 μm, 10 μm, 15 μm, 18 μm, 20 μm, 25 μm, 28 μm or 30 μm, may be selected. The surface of the terminal 210 is in the same direction as the first surface 110, a non-terminal surface 220 is coplanar with the second surface 120, and therefore this arrangement can further reduce the thickness of the packaged structure. It can be understood that the device 200 may be a die, an IC, a BGA or other active devices, among which the chip may be chips with different functions, such as a CPU chip, a radio-frequency driver chip or other processor chips, or the device 200 may be a passive device. When adopted, the passive device may be a capacitor, an inductor or a resistor. The dielectric layer 100 is arranged surrounding and wrapping the devices 200, and the first surface 110 of the dielectric layer 100 is provided with a first circuit layer 300, which is directly electrically connected to the terminals of the devices 200. It can be understood that such a connection mode solves the problem that the existing scheme requires accurate application of solder, and because the devices and the circuit are integrally electroplated for connection, so the stability of connection between the devices and the circuit is ensured, ensuring good electrical signals. Opposite from the first circuit layer 300, a second circuit layer 310 is arranged on the second surface 120 of the dielectric layer 100, and is coplanar with the second surface 120. As shown in FIG. 2, the first circuit layer 300 and the second circuit layer 310 are connected through metal pillars 400.

The schematic diagram of the overall structure of an embedded structure shown in FIG. 3 is another embodiment of the present application, which is roughly the same as the main structure of FIG. 2, and the difference mainly lies in the sequence of implementation of the process flow, which will be discussed in detail in the subsequent preparation flow, and therefore will not be repeated here.

It should be understood that although a specific structural schematic diagram of two devices 200 embedded in the dielectric layer 100 is shown in FIG. 2 or FIG. 3, in the embodiments of the present application, the number of the devices 200 embedded in the dielectric layer 100 is not limited to two, but may be one, three or more. However, no matter how many devices 200 are embedded in the dielectric layer 100, the devices 200 are connected to the other structural layers in the same way. It can also be understood that in the embodiments of the present application, the embedded structure is not limited to one layer, but may have two or more layers according to design requirements. However, no matter how many layers are designed, the overall structure designed is the same, having a first circuit layer 300, a dielectric layer 100 surrounding and wrapping a plurality of devices 200 and metal pillars 400 and a second circuit layer 310 in sequence from the top down. It should be noted that the manufacturing method of the present application is illustrated by taking a layer of embedded structure wrapping two devices as an example.

Figure 1A:
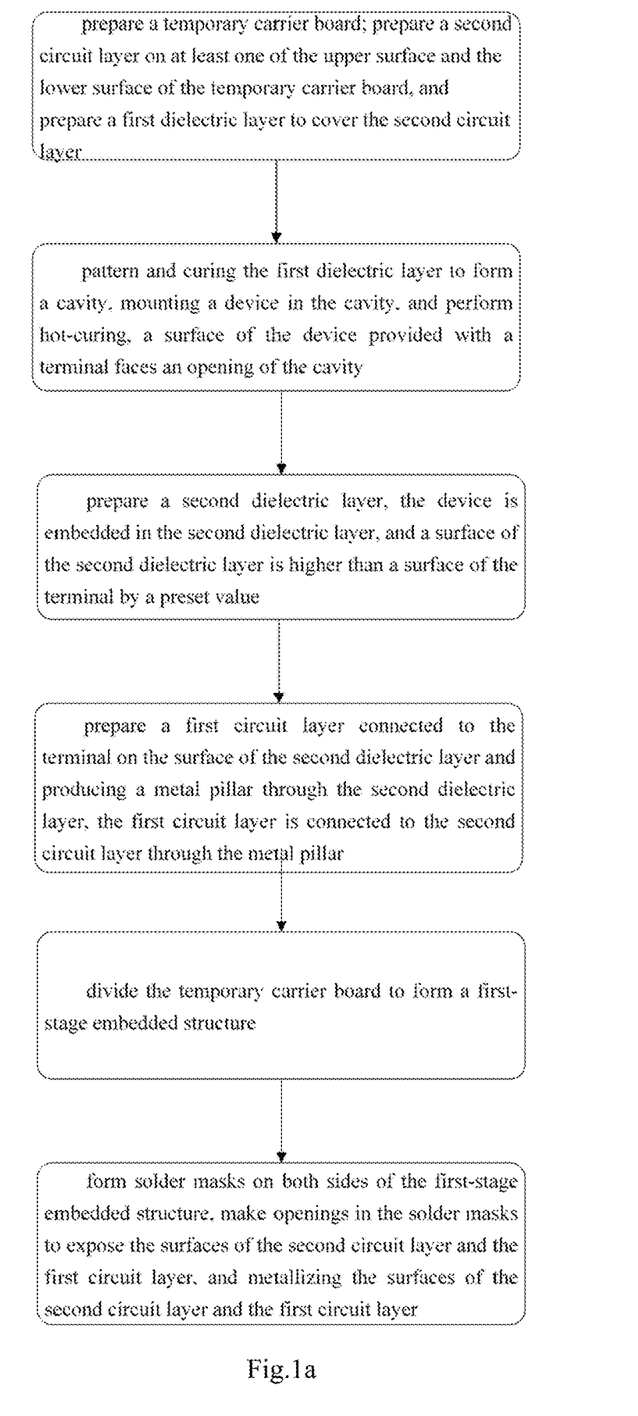
FIG. 1a is a flowchart of steps of a manufacturing method according to an embodiment of the present application.

In order to facilitate understanding of the embedded structure provided by the embodiments of the present application, as shown in FIG. 2, the first embodiment of the present application provides a method for preparing an embedded structure, and as shown in FIG. 1a, the method includes the following steps.

Preparing a temporary carrier board 500; preparing a second circuit layer 310 on at least one of the upper surface and the lower surface of the temporary carrier board 500, and preparing a first dielectric layer 130 to cover the second circuit layer 310.

Figure 4A:
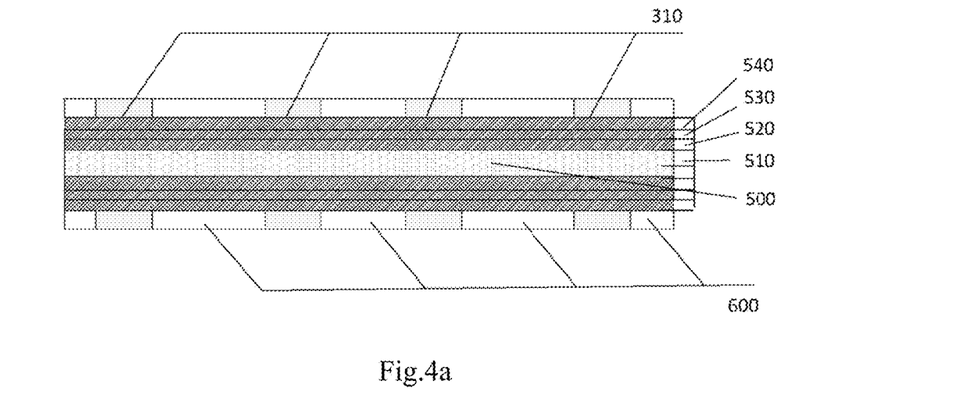
FIGS. 4a to 4j are cross-sectional views of intermediate states of a preparation flow according to an embodiment of the present application.
Figure 4B:
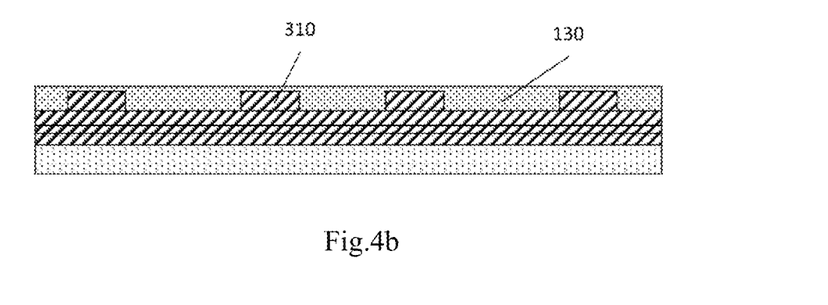
Figure 4C:
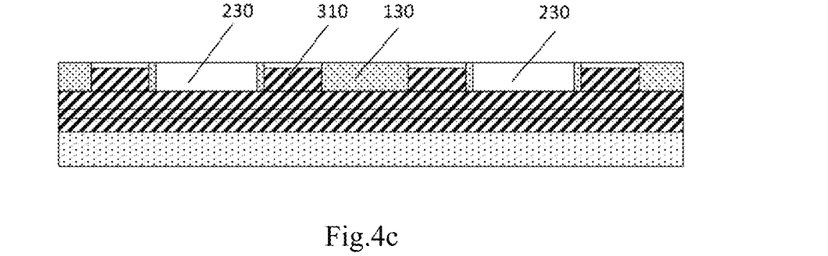

As shown in FIG. 4a, FIG. 4b and FIG. 4c, in FIG. 4a, photoresist 600 is laminated on the surface of a protective layer 540 for the carrier board, exposed and developed to obtain a windowed pattern for the second circuit layer 310; in FIG. 4b, the second circuit layer 310 is electroplated, the photoresist is removed, and a dielectric material is laminated to form the first dielectric layer 130, which is then pre-cured; and in FIG. 4c, the first dielectric layer 130 is patterned to expose the upper surface of the second circuit layer 310, and the dielectric material is completely hot-cured.

In actual implementation, in order to ensure the effect of filling, the usage of the dielectric material is generally calculated according to an actually required filling amount. Here, the surface of the laminated dielectric material should be 5 μm to 20 μm higher than the surface of the second circuit layer 310, and different differences, such as 5 μm, 10 μm, 15 μm, 18 μm or 20 μm, may be selected. One or a mixture of more of organic or inorganic dielectric materials, such as polyimide, epoxy resin, bismaleimide, triazine resin, ceramic filler and glass fiber, which are divided into photosensitive type dielectric materials and non-photosensitive type dielectric materials according to functional requirements at present, may be selected as the dielectric material. It should be noted that the present embodiment selects a photosensitive dielectric material to produce the dielectric layer 100, because when the photosensitive material is used, the surface of the exposed circuit or copper pillars does not need to be processed by a thinning process (such as laser or drilling) after the to-be-exposed part of the circuit or the copper pillars are exposed by patterning, that is, only patterning is adopted, and therefore the efficiency of production is increased. After lamination and leveling, overall thinning is not needed, so that the dielectric layer 100 can become more even and the underlying devices will not be injured in actual implementation as well, thus increasing the yield. When used to be laminated, the photosensitive dielectric material only needs to be subjected to hot-curing by a heating platform or photocuring for a short time. If a non-photosensitive material is adopted as the dielectric material, a thinning process, such as grinding or plasma etching, may be adopted to thin the whole dielectric material on the upper surface of the circuit until the upper surface of the circuit is exposed, or the dielectric material on the upper surface of the circuit may be sintered by adopting laser sintering to obtain the needed upper surface of the circuit.

As shown in FIG. 4a, the carrier board is of a symmetrical structure with a middle organic layer 510, a first metal layer 520, a second metal layer 530 and a protective layer 540 in sequence from the middle to both sides. It can be understood that the organic layer 510 may be selected from organic materials such as PP, the first metal layer 520 may be selected from metal materials such as copper, the second metal layer 530 may be selected from metal materials such as copper, the first metal layer 520 and the second metal layer 530 are formed by physical lamination, and the protective layer 540 is formed by electroplating, the material of which may be, but is not limited to, cu, ti, ni, CuWTi, CuNiCu or CuTiCu. The thickness of each layer of the carrier board can be adjusted, and in this embodiment, it is calculated from the organic layer 510. It should be noted that each layer may be selected from an 18 μm copper layer, a 3 μm copper layer and a 3-10 μm protective layer, and the metal of the protective layer may be nickel, titanium or the like. In actual preparation, since the carrier board is of the symmetrical structure, an embedded structure may be produced on each of the symmetrical surfaces of the carrier board. After the embedded structures are produced, the carrier board is divided into two substrates. Each substrate is a grid-like matrix array, including a plurality of units, with each unit having a device or a combination of more devices.

Patterning and curing are performed on the first dielectric layer 130 to form a cavity 230, devices 200 are mounted in the cavity 230, and hot-curing is performed, wherein the surfaces of the devices 200 provided with terminals 210 face the openings of the cavity 230.

Figure 4D:
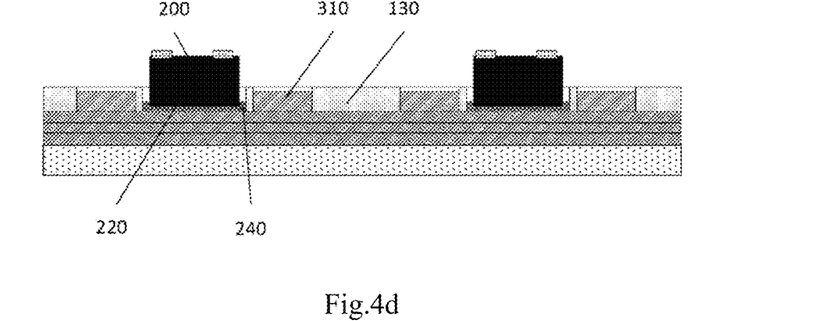

As shown in FIG. 4c and FIG. 4d, the first dielectric layer 130 is patterned to obtain the cavity 230 for mounting the devices. The size of the cavity may be designed according to the size of the device, and an adhesive material 240 is applied to the bottom of the cavity. There exist many alternatives for the adhesive material 240, which can be used to stick the devices and the underlying metal layers and is applied by dispensing or printing. The adhesive material 240 may be an organic or inorganic material, which is generally solder paste, silver paste, red glue or solder mask. In order to mount the device 200, the device 200 is provided with the terminals 210 and a corresponding non-terminal surface 220. During mounting, the non-terminal surface 220 of the device 200 is fixedly stuck to the adhesive material 240, and the adhesive material 240 is hot-cured. A high-precision conventional SMT flow may be adopted for mounting coupled with heated reflow soldering. It can be understood that the adhesive material 240 may not be arranged, and by applying DAF (ultra-thin film adhesive) on the non-terminal surface 220 of the device, the DAF is directly stuck to the underlying metal layers by a heating platform during mounting.

A second dielectric layer 140 is prepared, wherein the devices 200 are embedded in the second dielectric layer 140, and the surface of the second dielectric layer 140 is higher than the surfaces of the terminals of the devices by a preset value.

Figure 4E:
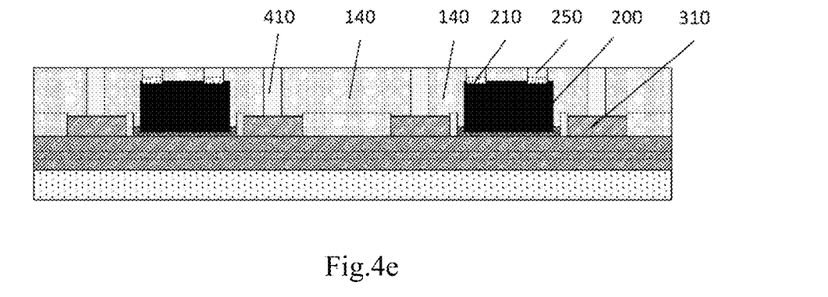

As shown in FIG. 4e, the dielectric material is laminated and patterned to expose cavity windows 250 and a conductive a metal pillar pattern 410, and the dielectric material is hot-cured.

Here, in order to ensure the effect of filling, the usage of the dielectric material is calculated according to a filling amount to be higher than the upper surface of the device by a certain thickness. It can be understood that the thickness by which the second dielectric layer is higher than the surfaces of the terminals 210 is 5 μm to 30 μm, and different differences, such as 5 μm, 10 μm, 15 μm, 18 μm, 20 μm, 25 μm or 30 μm, may be selected.

A first circuit layer 300 directly connected to the terminals 210 is prepared on the surface of the second dielectric layer 140, and metal pillars 400 are produced through the second dielectric layer 140, wherein the first circuit layer 300 is connected to the second circuit layer 310 through the metal pillars 400.

Figure 4F:
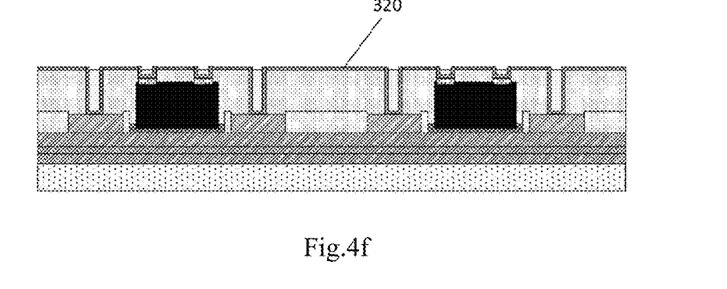
Figure 4G:
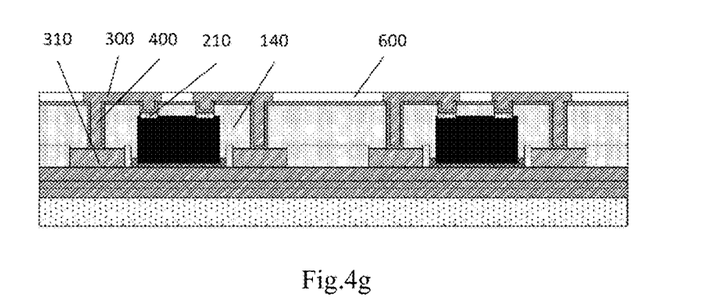

Referring to FIG. 4f and FIG. 4g, as shown in FIG. 4f, a seed layer is produced on the surface of the second dielectric layer 140, specifically the surfaces of the terminals 210, the inner surface of the conductive metal pillar pattern 410 and the surface 110 of the second dielectric layer 140. As shown in FIG. 4g, photoresist 600 is laminated on the seed layer and patterned to expose a to-be-electroplated pattern for the first circuit layer 300 and a to-be-electroplated pattern for the conductive metal pillars 400, and the pattern for the first circuit layer 300 and the pattern for the conductive metal pillars 400 are electroplated to obtain the first circuit layer 300 and the metal pillars 400.

It can be seen from the aforementioned steps that the first circuit layer 300 and the surfaces of the terminals 210 of the devices 200 are directly electrically connected through the seed layer by electroplating. It can be understood that such a connection mode solves the problem that the existing scheme requires accurate application of solder, and because the devices and the circuit are integrally electroplated for connection, so the stability of connection between the devices and the circuit is ensured, ensuring good electrical signals.

The seed layer is produced by forming a metal seed layer 320 on the surface of the second dielectric layer 140 by electroless copper plating or sputtering. The commonly used metals for the seed layer are, but are not limited to, iron, copper, iron and alloy. The thickness of the seed layer is generally 0.8 μm to 5 μm. It can be understood that in the present embodiment, a metal sputtering method may be selected to sputter titanium with a thickness of 0.1 μm or copper with a thickness of 1 μm.

The temporary carrier board 500 is divided to form a first-stage embedded structure.

Solder masks 700 are formed on the both sides of the first-stage embedded structure, openings are formed in the solder masks 700 to expose the surfaces of the second circuit layer 310 and the first circuit layer 300, and the surfaces of the second circuit layer 310 and the first circuit layer 300 are metallized.

Figure 4H:
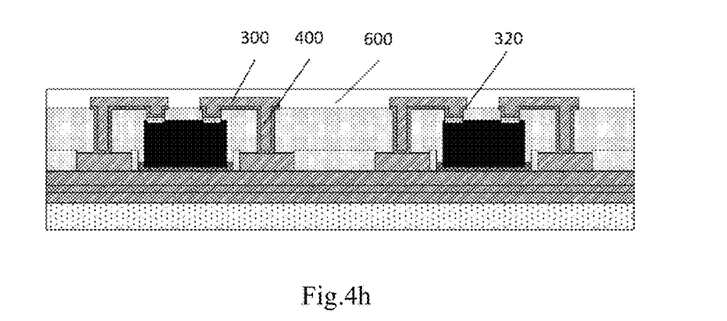
Figure 4I:
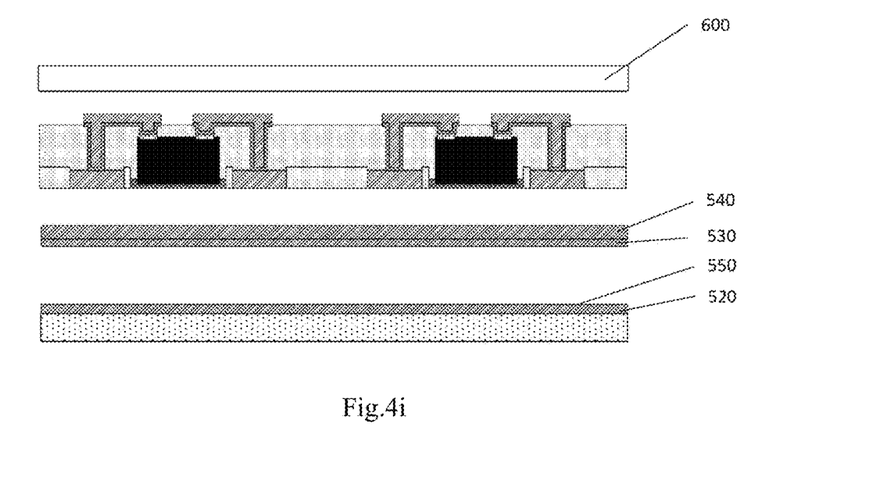
Figure 4J:
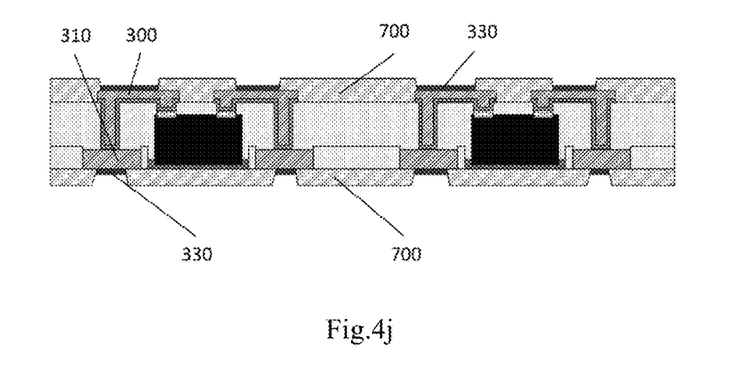

Specifically, referring to FIG. 4h, FIG. 4i and FIG. 4j, as shown in FIG. 4h, the photoresist 600 is removed, the seed layer 320 exposed on the surface of the second dielectric layer 140 is etched, the photoresist 600 is laminated to protect the circuit, and the whole board is divided after exposure. As shown in FIG. 4i, during division, division is performed from the first metal layer 520 and the second metal layer 530, and after a dividing surface 550, the second metal layer 530 and the protective layer 540 are respectively etched, the photoresist 600 is removed. When the protective layer 540 is separately etched, because the protective layer of the carrier board is thin, which is 3 μm to 10 μm thick in the present embodiment, the metal of the protective layer may be nickel, titanium or the like, which is different from the metal used for the second metal layer 530, so that different etchants may be used and the etching amount is small. Therefore, the influence on the circuit layer after etching the protective layer is relatively negligible. After division is complete, as shown in FIG. 4j, solder masks are produced on the upper surface and the lower surface of the substrate. The production of the solder masks includes: substrate surface treatment, solder mask layer printing, hot pre-curing, exposure, development and hot curing. The upper surface and the lower surface of the substrate are then subjected to metal surface treatment to form metal surface layers 330, and thereby a substrate with an embedded structure as shown in FIG. 2 is obtained.

It should be noted that the flow of the steps of the manufacturing method for an embedded structure provided by the first embodiment of the present application is merely an exemplary specific flow for a layer of embedded structure, and more than one layer of embedded structure can be obtained by repeating the aforementioned steps according to need.

Figure 1B:
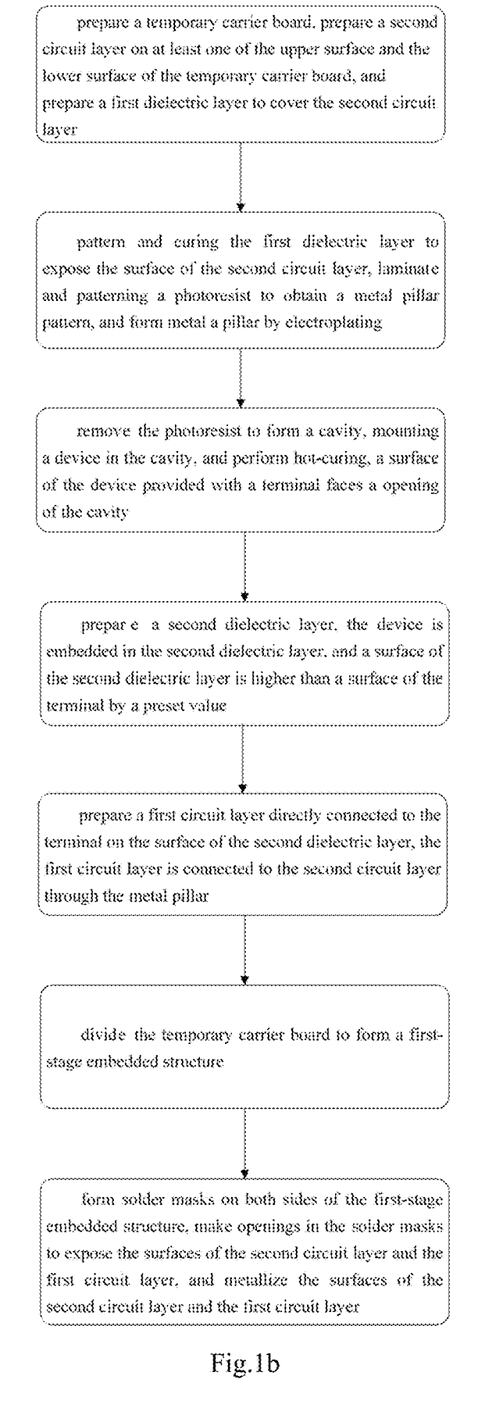
FIG. 1b is a flowchart of steps of a manufacturing method according to another embodiment of the present application.

According to a manufacturing method of another embodiment of the present application, a substrate with an embedded structure as shown in FIG. 3 can be produced. The manufacturing method (see FIG. 1b) is substantially the same as the preparation flow of the first embodiment of the present application, except that there are some differences in details, as shown in the following steps.

Preparing a temporary carrier board 500, preparing a second circuit layer 310 on at least one of the upper surface and the lower surface of the temporary carrier board 500, and preparing a first dielectric layer 130 to cover the second circuit layer 310.

Figure 5A:
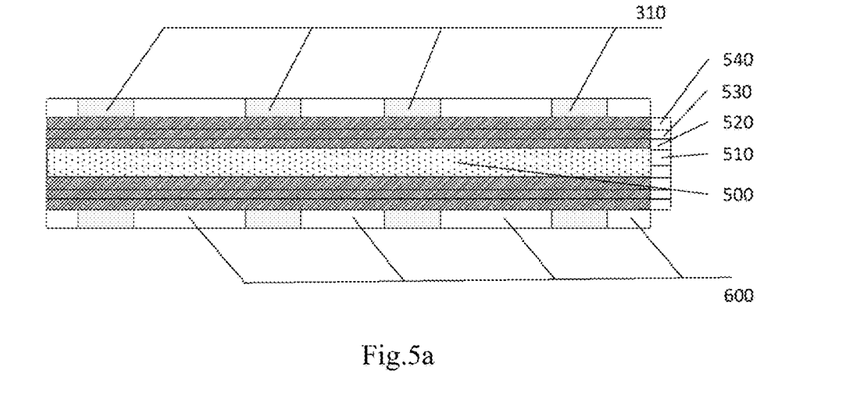
FIGS. 5a to 5l are cross-sectional views of intermediate states of a preparation flow according to another embodiment of the present application.
Figure 5B:
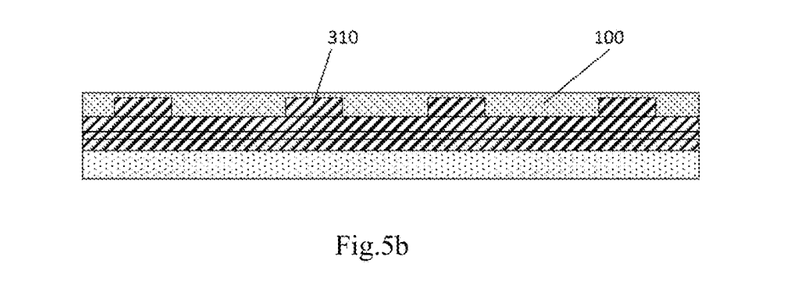
Figure 5C:
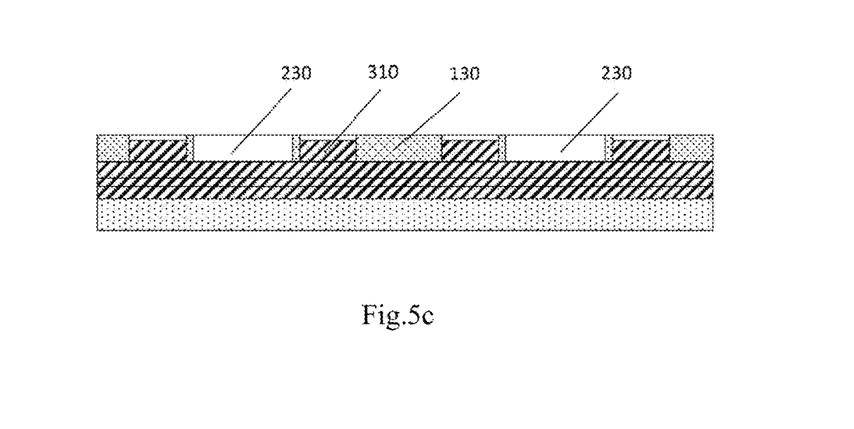

As shown in FIG. 5a, FIG. 5b and FIG. 5c, in FIG. 5a, photoresist 600 is laminated on the surface of a protective layer 540 for the carrier board, exposed and developed to obtain a windowed pattern for the second circuit layer 310; in FIG. 4i, the second circuit layer 310 is electroplated, the photoresist is removed, and a dielectric material is laminated to form the first dielectric layer 130, which is then pre-cured; and in FIG. 5c, the first dielectric layer 130 is patterned to expose the upper surface of the second circuit layer 310, and the dielectric material is completely hot-cured.

In actual implementation, in order to ensure the effect of filling, the usage of the dielectric material is generally calculated according to an actually required filling amount. Here, the surface of the laminated dielectric material should be 5 µm to 20 µm higher than the surface of the second circuit layer 310, and different differences, such as 5 µm, 10 µm, 15 µm, 18 µm or 20 µm, may be selected.

Patterning and curing the first dielectric layer 130 to expose the surface of the second circuit layer 310, laminating and patterning photoresist 600 to obtain a metal pillar pattern 410, and forming metal pillars 400 by electroplating; and removing the photoresist 600 to form a cavity 230, mounting devices 200 in the cavity 230, and performing hot-curing, wherein the surfaces of the devices 200 provided with the terminals 210 face the openings of the cavity 230.

Figure 5D:
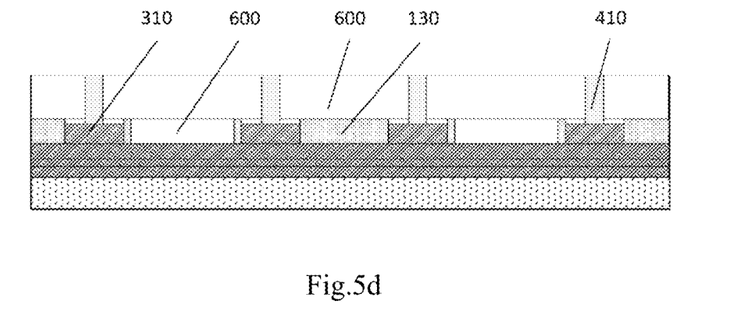
Figure 5E:
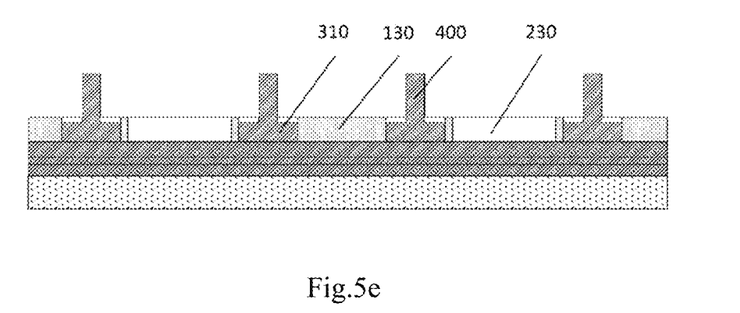
Figure 5F:
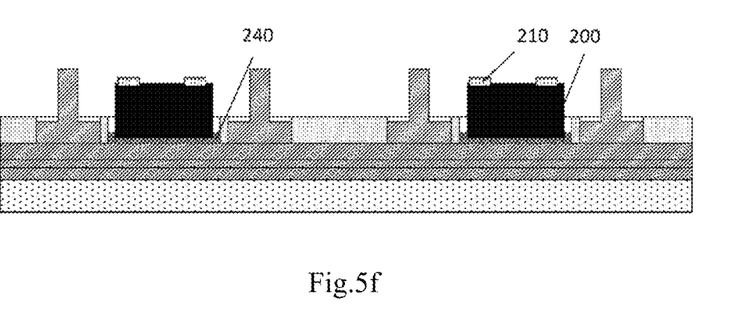

Referring to FIG. 5c, FIG. 5d, FIG. 5e and FIG. 5f, as shown in FIG. 5c, the first dielectric layer 130 is patterned to obtain the cavity 230 for mounting the devices, and after being laminated, the photoresist 600 is patterned to obtain the conductive metal pillar pattern 410; as shown in FIG. 5d and FIG. 5e, the conductive metal pillars 400 are electroplated, and the photoresist 600 is removed; as shown in FIG. 5f, an adhesive material 240 is applied on the bottom of the cavity 230 for the devices, the devices 200 are mounted, wherein the device 200 is provided with terminals 210 and a corresponding non-terminal surface 220 without terminals 210, and during mounting, the non-terminal 220 of the device 200 is fixedly stuck to the adhesive material 240, which is then hot-cured. It can be understood that the adhesive material 240 may not be arranged, and by applying a DAF (ultra-thin film adhesive) on the non-terminal surface 220 of the device, the DAF is directly stuck to the underlying metal layers by a heating platform during mounting.

A second dielectric layer 140 is prepared, wherein the devices 200 are embedded in the second dielectric layer 140, and the surface of the second dielectric layer 140 is higher than the surfaces of the terminals 210 by a preset value.

Figure 5G:
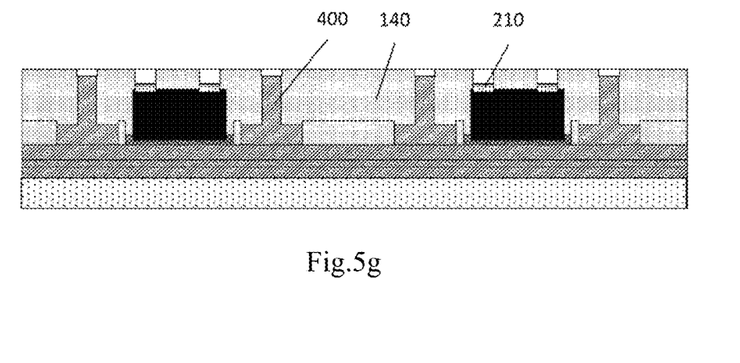

Referring to FIG. 5g, the dielectric material is laminated and patterned to expose cavity windows 250 and the upper surfaces of the metal pillars 400, and the dielectric material is hot-cured.

Here, in order to ensure the effect of filling, the usage of the dielectric material is calculated according to a filling amount to be higher than the upper surface of the device by a certain thickness. It can be understood that the thickness by which the second dielectric layer is higher than the surfaces of the terminals 210 is 5 µm to 30 µm, and different differences, such as 5 µm, 10 µm, 15 µm, 18 µm, 20 µm, 25 µm or 30 µm, may be selected.

A first circuit layer 300 directly connected to the terminals 210 is prepared on the surface of the second dielectric layer 140, wherein the first circuit layer 300 is connected to the second circuit layer 310 through the metal pillars 400.

Figure 5H:
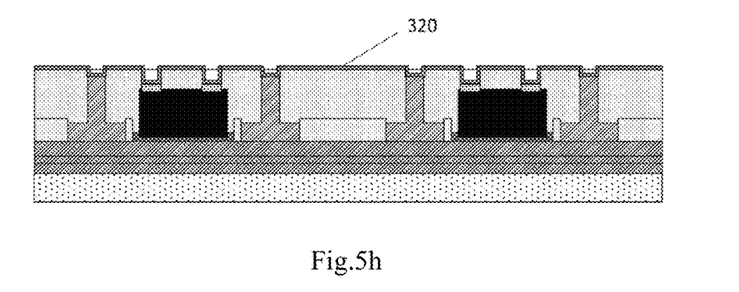
Figure 5I:
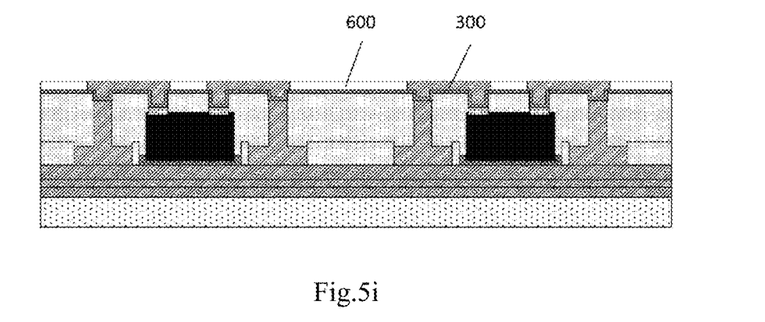

Referring to FIG. 5h and FIG. 5i, as shown in FIG. 5h, a seed layer is produced on the surface of the second dielectric layer 140, specifically the surfaces of the terminals 210, the upper surfaces of the metal pillars 400 and the surface 110 of the second dielectric layer 140. As shown in FIG. 5i, photoresist 600 is laminated on the seed layer and patterned to expose a to-be-electroplated pattern for the first circuit layer 300, and electroplating is performed to obtain the first circuit layer 300.

It can be seen from the aforementioned steps that the first circuit layer 300 and the surfaces of the terminals 210 of the devices 200 are directly electrically connected through the seed layer by electroplating. It can be understood that such a connection mode solves the problem that the existing scheme requires accurate application of solder, and because the devices and the circuit are integrally electroplated for connection, so the stability of connection between the devices and the circuit is ensured, ensuring good electrical signals.

The preparation flow of the seed layer is the same as that of the seed layer in the first embodiment of the present application, and therefore will not be repeated here.

Dividing the temporary carrier board to form a first-stage embedded structure; and Forming solder masks 700 on both sides of the first-stage embedded structure, making openings in the solder masks 700 to expose the surfaces of the second circuit layer 310 and the first circuit layer 300, and metallizing the surfaces of the second circuit layer 310 and the first circuit layer 300.

Figure 5J:
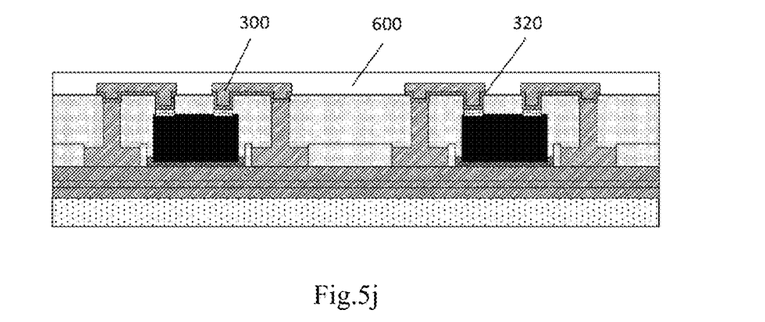
Figure 5K:
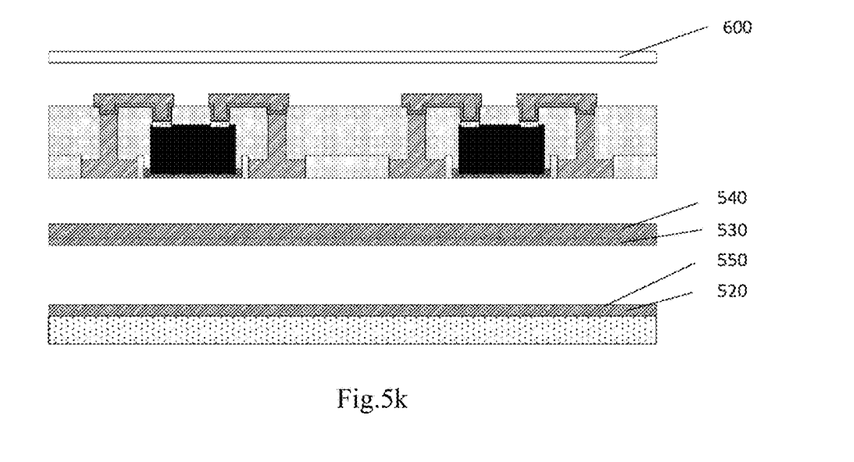
Figure 5L:
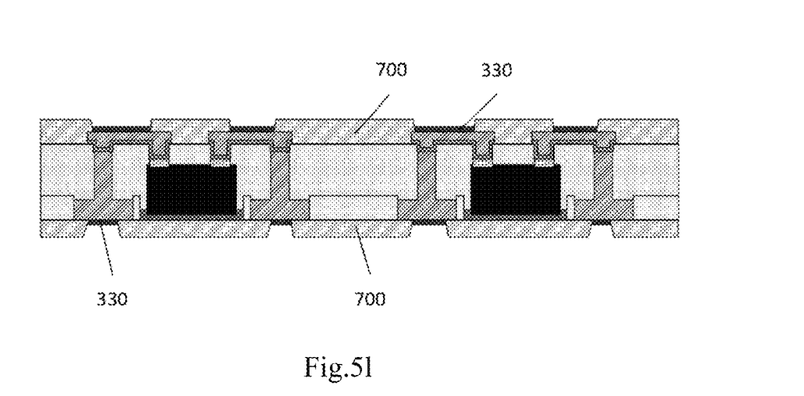

Referring to FIG. 5j, FIG. 5k and FIG. 45l, as shown in FIG. 5j, the photoresist 600 is removed, the seed layer 320 exposed on the surface of the second dielectric layer 140 is etched, the photoresist 600 is laminated to protect the circuit, and the whole board is divided after exposure. As shown in FIG. 5k, during division, division is performed from the first metal layer 520 and the second metal layer 530, and after a dividing surface 550, the second metal layer 530 and the protective layer 540 are respectively etched, the photoresist 600 is removed. When the protective layer 540 is separately etched, because the protective layer of the carrier board is thin, which is 3 µm to 10 µm thick in the present embodiment, the metal of the protective layer may be nickel, iron or the like, which is different from the metal used for the second metal layer 530, so that different etchants may be used and the etching amount is small. Therefore, the influence on the circuit layer after etching the protective layer is relatively negligible. After division is complete, as shown in FIG. 5l, solder masks are produced on the upper surface and the lower surface of the substrate, metal surface treatment is then performed to form metal surface layers 330, and thereby a substrate with an embedded structure as shown in FIG. 2 is obtained.

It should be noted that, according to need, a multilayer embedded structure substrate with a plurality of layers can be prepared by repeating some of the aforementioned intermediate steps. It can be concluded from the aforementioned flow that according to the embedded structure provided by the present application, the substrate with the device embedded structure can be produced by carrying out the preparation flow once, thus solving the problem that device embedding needs to be carried out in two steps in the existing technology. Therefore, compared with the existing technology, the present application reduces process steps, decreases the difficulty of manufacturing, improves the quality of products and reduces the manufacturing cost.

Since the present application adopts the device embedding feature, it is convenient to monitor and inspect the quality of connection between the devices and the circuit through appearance monitoring in the process of manufacturing.

By arranging the terminals upward, the device is connected to the carrying metal of the carrier board by applying the adhesive material or the DAF (ultra-thin film adhesive) on the whole back of the device, effectively solving the potential problem of defective filling between the circuit and the device as a result of the terminals facing downward.

By arranging the terminals upward to connect the device 200 to the underlying carrier board through the adhesive material, the device 200 and the second circuit layer 310 are on the same reference plane, thus further reducing the overall thickness of the package.

The preferred embodiments of the present application have been described in detail above with reference to the drawings. However, the present application is not limited to the aforementioned embodiments. Those skilled in the art can also make various equivalent modifications or replacements without departing from the spirit of the present application, and these equivalent modifications or replacements shall be included in the scope defined by the claims of the present application.

What is claimed is:

1. A manufacturing method for an embedded structure, comprising:
   preparing a temporary carrier board; preparing a second circuit layer on at least one of the upper surface and the lower surface of the temporary carrier board, and preparing a first dielectric layer to cover the second circuit layer;
   patterning and curing the first dielectric layer to form a cavity, mounting a device in the cavity, and performing hot-curing, wherein a surface of the device provided with a terminal faces an opening of the cavity;
   preparing a second dielectric layer, wherein the device is embedded in the second dielectric layer, and a surface of the second dielectric layer is higher than a surface of the terminal by a preset value;
   preparing a first circuit layer connected to the terminal on the surface of the second dielectric layer and producing a metal pillar through the second dielectric layer, wherein the first circuit layer is connected to the second circuit layer through the metal pillar;
   dividing the temporary carrier board to form a first-stage embedded structure; and
   forming solder masks on both sides of the first-stage embedded structure, making openings in the solder masks to expose the surfaces of the second circuit layer and the first circuit layer, and metallizing the surfaces of the second circuit layer and the first circuit layer.

2. The manufacturing method of claim 1, wherein preparing a temporary carrier board; preparing a second circuit layer on at least one of the upper surface and the lower surface of the temporary carrier board comprises:
   laminating photoresist on at least one of the upper surface and the lower surface of the temporary carrier board;
   exposing and developing the photoresist to obtain a windowed pattern for the second circuit layer; and
   electroplating the windowed pattern and removing the photoresist to form the second circuit layer.

3. The manufacturing method of claim 1, wherein preparing a first circuit layer connected to the terminal on the surface of the second dielectric layer and producing a metal pillar through the second dielectric layer comprises:
   forming a metal seed layer on the surface of the second dielectric layer by electroless copper plating or sputtering;
   laminating photoresist, and patterning the photoresist to expose a pattern for the first circuit layer and a metal pillar pattern; and
   electroplating the pattern for the first circuit layer and the metal pillar pattern to form the first circuit layer and the metal pillar,
   wherein the first circuit layer is directly electrically connected to the terminal through the seed layer.

4. The manufacturing method of claim 1, wherein the range of the preset value is between 5 µm and 30 µm.

5. The manufacturing method of claim 1, wherein the temporary carrier board is of a four-layer symmetrical structure with an organic layer, a first metal layer, a second metal layer and a protective layer from the middle to both sides in sequence.

6. The manufacturing method of claim 1, wherein mounting a device in the cavity and performing hot-curing comprises:
   applying an ultra-thin film adhesive on a non-terminal surface of the device, and directly sticking the device to the temporary carrier board under the cavity by heating;
   or fixedly sticking the device to an adhesive material by applying the adhesive material to the bottom of the cavity.

7. The manufacturing method of claim 1, wherein the dielectric material of the first dielectric layer and the second dielectric layer is a photosensitive or non-photosensitive dielectric material.

8. A manufacturing method for an embedded structure, comprising:
   preparing a temporary carrier board, preparing a second circuit layer on at least one of the upper surface and the lower surface of the temporary carrier board, and preparing a first dielectric layer to cover the second circuit layer;
   patterning and curing the first dielectric layer to expose the surface of the second circuit layer, laminating and patterning a photoresist to obtain a metal pillar pattern, and forming metal a pillar by electroplating;
   removing the photoresist to form a cavity, mounting a device in the cavity, and performing hot-curing, wherein a surface of the device provided with a terminal faces a opening of the cavity;

preparing a second dielectric layer, wherein the device is embedded in the second dielectric layer, and a surface of the second dielectric layer is higher than a surface of the terminal by a preset value;

preparing a first circuit layer directly connected to the terminal on the surface of the second dielectric layer, wherein the first circuit layer is connected to the second circuit layer through the metal pillar;

dividing the temporary carrier board to form a first-stage embedded structure; and forming solder masks on both sides of the first-stage embedded structure, making openings in the solder masks to expose the surfaces of the second circuit layer and the first circuit layer, and metallizing the surfaces of the second circuit layer and the first circuit layer.

* * * * *